(12) United States Patent
Fastow et al.

(10) Patent No.: US 6,510,085 B1
(45) Date of Patent: *Jan. 21, 2003

(54) METHOD OF CHANNEL HOT ELECTRON PROGRAMMING FOR SHORT CHANNEL NOR FLASH ARRAYS

(75) Inventors: Richard Fastow, Cupertino, CA (US); Sheunghee Park, Santa Clara, CA (US); Zhigang Wang, San Jose, CA (US); Sameer Haddad, San Jose, CA (US); Chi Chang, Redwood City, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/861,031

(22) Filed: May 18, 2001

(51) Int. Cl.[7] .............................................. G11C 16/04
(52) U.S. Cl. .......................... 365/185.28; 365/185.26; 365/185.33
(58) Field of Search ................... 365/185.28, 185.26, 365/185.33, 185.14, 185.19, 185.24, 185.29, 185.21

(56) References Cited

U.S. PATENT DOCUMENTS 6,166,960 A * 12/2000 Marneweck et al. ... 365/185.28
6,172,909 B1 * 1/2001 Haddad et al. ........ 365/185.19
6,275,415 B1 * 8/2001 Haddad et al. ........ 365/185.11

* cited by examiner

Primary Examiner—Viet Q. Nguyen
Assistant Examiner—David Lam
(74) Attorney, Agent, or Firm—Wagner Murabito & Hao LLP

(57) ABSTRACT

Methods of programming and soft programming short channel NOR flash memory cells that reduce the programming currents and column leakages during both programming and soft programming while maintaining fast programming speeds. During programming, a voltage of between 7 and 10 volts is applied to the control gate, a voltage of between 4 and 6 volts; is applied to the drain, a voltage of between 0.5 and 2.0 volts is applied to the source and a voltage of between minus 2 and minus 0.5 volts is applied to the substrate of the selected cell to be programmed. During soft programming, a voltage of between 0.5 and 4.5 volts is applied to the control gates, between 4 and 5.5 volts is applied to the drains, between 0.5 and 2 volts is applied to the sources and between minus 2.0 and minus 0.5 volts is applied to the substrates of the memory cells.

8 Claims, 6 Drawing Sheets

METHOD OF CHANNEL HOT ELECTRON PROGRAMMING FOR SHORT CHANNEL NOR FLASH ARRAYS

BACKGROUND OF THE INVENTION

1. Field of the Invention

This invention relates generally to programmable semiconductor flash memory cells. More specifically, this invention relates to a method of programming short channel NOR flash memory cells using channel hot electrons. Even more specifically, this invention relates to methods of programming and soft programming short channel NOR flash memory cells that reduce the programming currents and column leakages during programming while maintaining fast programming speeds.

2. Discussion of the Related Art

One type of programmable memory cell is commonly referred to as a flash memory cell. The structure of one type of flash memory cell includes a source and a drain formed in a silicon substrate. The structure of another type of flash memory cell includes a source and a drain formed in a well that is formed in a silicon substrate. The flash memory cell includes a stacked gate structure formed on the silicon substrate. The region of the silicon substrate beneath the stacked gate structure is known as the channel region of the flash memory cell.

The stacked gate structure of a flash memory cell includes a pair of polysilicon structures separated by oxide layers. One of the polysilicon structures functions as a floating gate and the other polysilicon structure functions as a control gate for the flash memory cell. The oxide layer that separates the floating gate from the silicon substrate is commonly referred to as the tunnel oxide layer.

Prior programming operations on a flash memory cell involve the application of a relatively large constant voltage to the drain of the flash memory cell while an even larger voltage is applied to the control gate. During such programming operations, the source and p-well of the flash memory cell are maintained at or near ground level in relation to the voltages applied to the control gate and drain.

Such a relatively high voltage potential applied between the drain and source causes electrons to flow through the channel region from the source to the drain. The electrons flowing between the source and drain can attain relatively high kinetic energy levels near the drain. In addition, the high constant voltage applied to the control gate raises the voltage potential of the floating gate to a high level at the start of the programming operation, and a relatively high programming current in the cell being programmed results. Under these conditions, electrons in the channel region having sufficiently high kinetic energy migrate through the tunnel oxide layer and onto the floating gate. This phenomenon is referred to as hot carrier programming or hot carrier injection. A successful programming operation involves the injection of sufficient numbers of electrons onto the floating gate to achieve a desired threshold voltage for the flash memory cell. The threshold voltage is the voltage that must be applied to the control gate of a flash memory cell to cause conduction through the channel region during a read operation on the flash memory cell. The time involved in a programming operation depends upon the rate at which electrons are injected onto the floating gate. As can be appreciated, the slower the rate of injection the longer the programming time to reach the desired threshold voltage.

The microelectronic flash or block-erase Electrically Erasable Programmable Read-Only Memory (Flash EEPROM) includes an array of cells that can be independently programmed and read. The size of each cell and thereby the memory are made small by omitting transistors known as select transistors that would enable the cells to be erased independently. As a result, all of the cells must be erased together as a block.

A flash memory device of this type includes individual Metal-Oxide-Semiconductor (MOS) field effect transistor (FET) memory cells. Each of the FETs includes a source, a drain, a floating gate and a control gate to which various voltages are applied to program the cell with a binary 1 or 0, to read the cells, or to erase all of the cells as a block.

The cells are connected in an array of rows and columns, with the control gates of the cells in a row being connected to a respective wordline and the drains of the cells in a column being connected to a respective bitline. The sources of the cells are connected together. This arrangement is known as a NOR memory configuration.

A cell can be programmed by applying programming voltages as follows: a voltage, typically in the range of 8–10 volts to the control gate, a voltage in the range of 4 to 5.5 volts to the drain, grounding the source and grounding the substrate or p-well. As discussed above, these voltages cause hot electrons to be injected from a drain depletion region into the floating gate. Upon removal of the programming voltages, the injected electrons are trapped in the floating gate and create a negative charge therein that increases the threshold voltage of the cell to a value in excess of approximately 4 volts.

In channel hot electron programming, hot electrons created by high lateral fields near the drain junction are injected into the floating gate. As discussed above, typical operating voltages for channel hot electron operation are: $V_D$=4.0–5.5V, $V_G$=8–10V, $V_s$~0 V and $V_{sub}$~0 V. One of the limitations of channel hot electron programming for short channel NOR flash memory arrays is that the unselected cells sharing the same bitline begin to leak current when the high drain voltage is applied to the bitline. This leakage current $I_d$ is due to the Dibl (drain induced barrier lowering) effect in short channel devices. The combination of a large leakage current from the unselected cells and a large programming current from the selected cell being programmed results in unacceptably high total programming currents during device programming operation.

Therefore, what is needed is a method of programming to reduce or eliminate the leakage current for the unselected cells without decreasing the programming speed of the selected bit being programmed.

SUMMARY OF THE INVENTION

According to the present invention, the foregoing and other objects and advantages are obtained by methods of programming and soft programming short channel NOR flash memory cells that reduce the programming currents and column leakages during the programming and soft programming operations.

In accordance with a first aspect of the invention, during programming a voltage of between 7 and 10 volts is applied to the control gate, a voltage of between 4 and 6 volts is applied to the drain, a voltage of between 0.5 and 2.0 volts is applied to the source and a voltage of between minus 2 and minus 0.5 volts is applied to the substrate of the selected cell to be programmed. In accordance with a second aspect of the invention, during soft programming, a voltage of between 0.5 and 4.5 volts is applied to the control gates, a voltage of between 4 and 5.5 volts is applied to the drains, a voltage of between 0.5 and 2 volts is applied to the sources and a voltage of between minus 2.0 and minus 0.5 volts is applied to the substrates of the memory cells being soft programmed.

In accordance with another aspect of the invention, the selected voltages applied during programming and soft programming are determined during either computer modeling or an empirical precharacterization procedure.

The described invention thus provides methods of programming and soft programming short channel NOR flash memory cells that reduce the programming currents and column leakages during the programming and soft programming operations.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawing and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

FIGS. 6–8 demonstrate the effectiveness of using the programming methods of the present invention, wherein;

FIG. 6 illustrates the measurement methods to determine the values graphed in FIGS. 7 & 8;

FIG. 7 shows the relationship of cell Vt @ Vt=1 $\mu$A and program time with varying $V_s$ and $I_{leakage}$ and a constant $V_d$;

FIG. 8 shows the effect of applying a varying substrate bias to the cells during the programming operation in accordance with the present invention.

DETAILED DESCRIPTION

Reference is now made in detail to a specific embodiment or specific embodiments of the present invention that illustrate the best mode or modes presently contemplated by the inventors for practicing the invention.

Figure 1A:
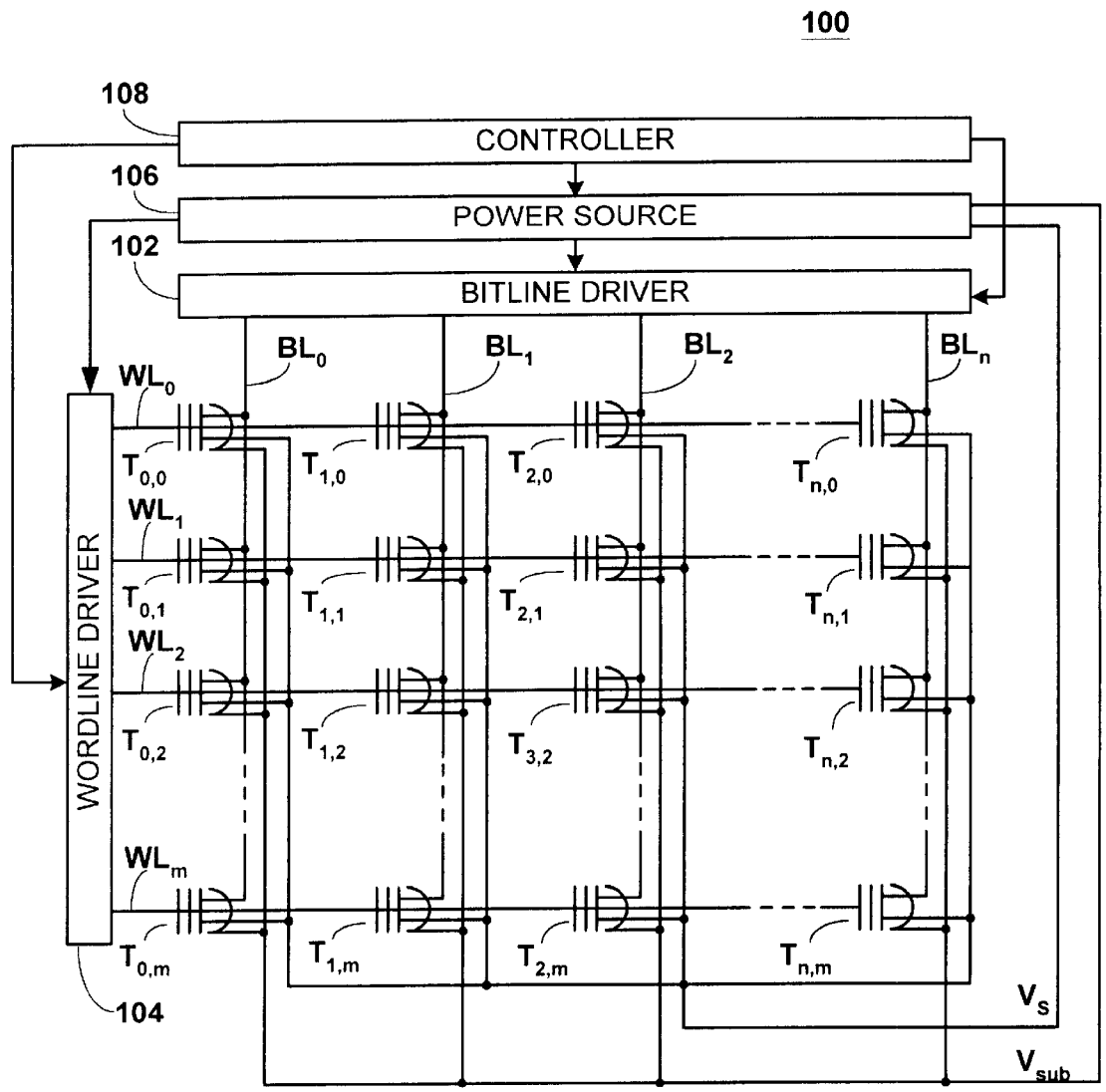
FIG. 1A is a simplified electrical schematic diagram of programmable flash memory EEPROM device.

FIG. 1A illustrates a basic configuration of a NOR type flash Electrically Erasable Programmable Read-Only Memory (EEPROM) 100 to which the present invention is advantageously applied. The flash memory 100 comprises a plurality of core or memory cells, which are arranged in a rectangular matrix or array of rows and columns. Each row is associated with a wordline (WL), whereas each column is associated with a bitline (BL).

Assuming that there are n columns and m rows, the bitlines are designated as $BL_0$ to $BL_n$ and the wordlines are designated as $WL_0$ to $WL_m$. A bitline driver 102 applies appropriate voltages to the bitlines and appropriate voltages are applied to the wordlines by a wordline driver 104. The voltages applied to the drivers 102 and 104 are generated by a power source 106 under the control of a controller 108, which is typically on-chip logic circuitry. The controller 108 also controls the drivers 102 and 104 to address the memory cells individually or collectively as will be described below.

A memory cell is located at each junction of a wordline and a bitline. Each cell includes a Metal-Oxide-Semiconductor (MOS) Field Effect Transistor (FET) having a source and drain formed in a semiconductor substrate, a floating gate, and a control gate separated from the floating gate by a layer of oxide. As should be appreciated, the cells of a flash EEPROM differ from conventional FETs in that they include the floating gate and tunnel oxide layer disposed between the control gate and the semiconductor substrate in which the source and drain are formed.

The cells illustrated in FIG. 1A are designated using the notation $T_{n,m}$, where m is the row (wordline) number and n is the column (bitline) number. The control gates of the cells are connected to respective wordlines, and the drains of the cells are connected to respective bitlines as illustrated. The sources of all of the cells are connected to the power source 106.

Figure 1B:
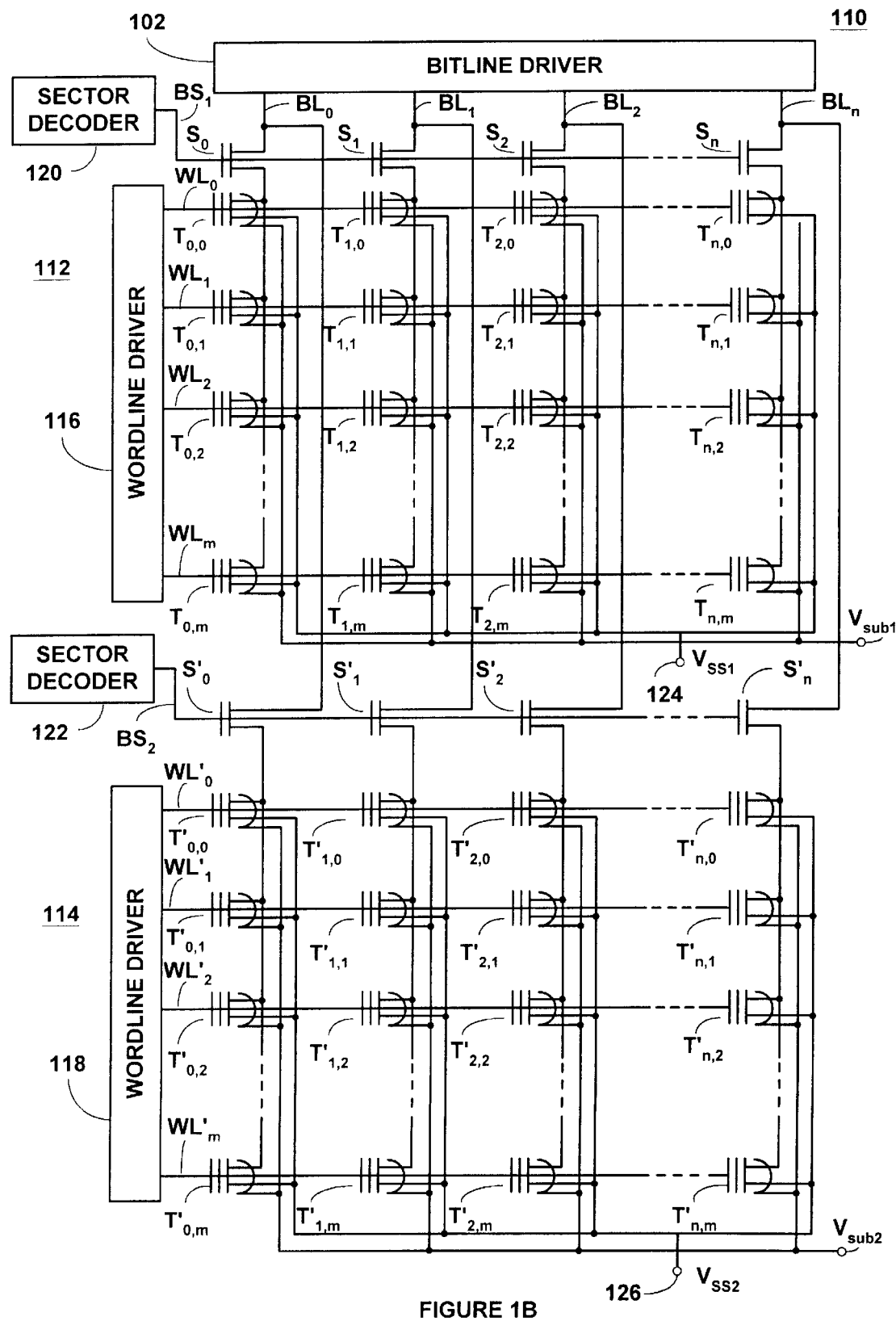
FIG. 1B is similar to FIG. 1A but illustrates a programmable flash memory EEPROM device having cells arranged in two pages, blocks or banks.

FIG. 1B illustrates another flash EEPROM memory 110 that is similar to the memory 100 except that the cells are divided into banks, (also known as pages or sectors), two of which are shown in FIG. 1B, each of which can be programmed, erased, and read independently. The memory 110 includes a first cell bank or page 112 and a second cell bank or page 114. The memory cells in the first bank 112 are designated in the same manner as in FIG. 1A, whereas a prime symbol is added to the designations of the cells in the second bank 114. The wordlines of the banks 112 and 114 are connected to separate wordline drivers 116 and 118, respectively.

In addition to the memory cells, each bank 112 and 114 includes a select or pass transistor for each bitline. The select transistors for the banks 112 and 114 are designated as $S_0$ to $S_n$ and $S'_0$ to $S'_n$, respectively. The drains of the select transistors are connected to the respective bitlines, whereas the sources of the select transistors are connected to the drains of the transistors for the wordlines $WL_0$ to $WL_m$ and $WL'_0$ to $WL'_m$.

The select transistors differ from the memory cell transistors in that they are conventional MOSFETs and therefore lack floating gates. The select transistors are switching elements rather than memory elements. The gates of the select transistors for the bank 112 are connected to a bank select $BS_1$, of a sector decoder 120 and the gates of the select transistors for the bank 114 are connected to a bank select output $BS_2$ of a sector decoder 122. The sources of the cells in bank 112 are connected to a common source supply voltage $V_{SS1}$ 124 and the sources of the cells in the bank 114 are connected to a common source supply voltage $V_{SS2}$ 126. The p-wells (substrates) of the cells in bank 112 are connected to a common substrate voltage $V_{sub1}$ 125 and the p-wells of the cells in bank 114 are connected to a common substrate voltage $V_{sub2}$ 127.

The bank 112 is selected by applying a logically high signal to the bank select line $BS_1$ that turns on the transistors $S_0$ to $S_n$ and connects the bitlines $BL_0$ to $BL_n$ to the underlying memory cells. The bank 112 is deselected by applying a logically low signal to the bank select line $BS_1$ that turns off the transistors $S_0$ to $S_n$ and disconnects the memory cells from the bitlines. The bank 114 is selected and deselected in an essentially similar manner using the bank select signal $BS_2$ and select transistors $S'_0$ to $S'_n$. The operation of the memory 110 is essentially similar to that of the memory 100 (FIG. 1A), except that the program, erase and read operations can be performed on the banks 112 & 114 independently or simultaneously.

Figure 2:
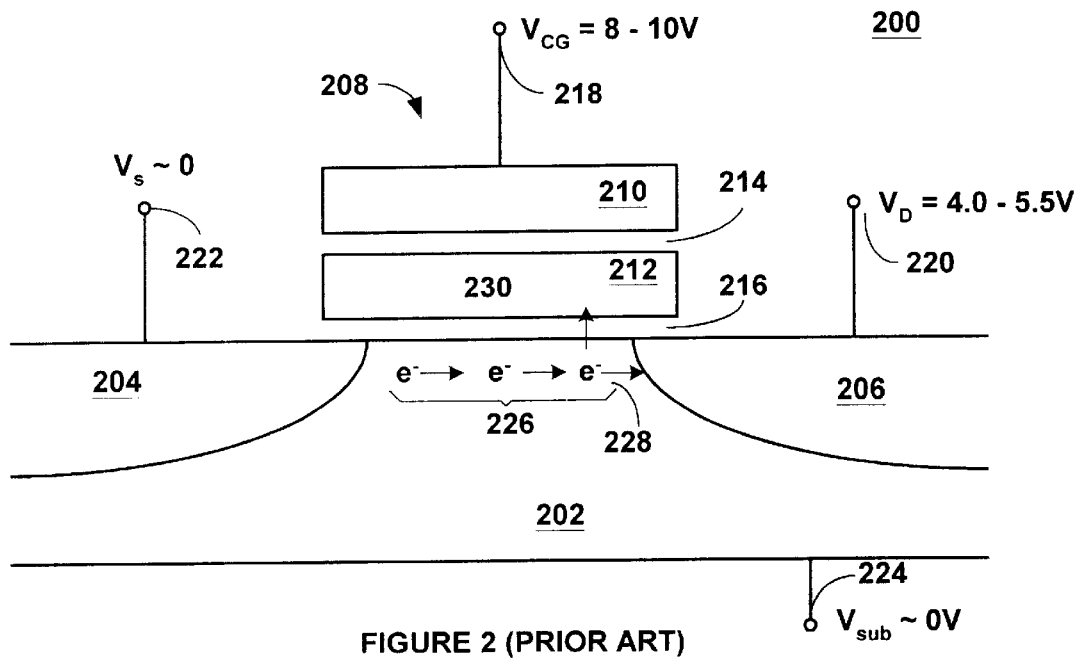
FIG. 2 illustrates the elements of an individual flash memory cell in a programming configuration in accordance with prior art methods.

FIG. 2 illustrates the elements of a flash memory cell 200 with prior art programming voltages applied to the various elements. The flash memory cell 200 is formed in and on a silicon substrate 202. The silicon substrate 200 is typically a p-type substrate in one configuration. In another configuration the silicon substrate can be an n-type substrate. The flash memory cell 200 includes a pair of doped regions 204 & 206 formed in the silicon substrate 202. The doped regions 204 & 206 are n+type doped regions for the p-type substrate. The doped region 204 functions as a source and the doped region 206 functions as a drain region. The flash memory cell 200 includes a stacked gate structure 208 comprising a control gate 210 and a floating gate 212 separated by a layer 214 of dielectric, typically a layer of silicon dioxide. The floating gate 212 is separated from the upper surface of the substrate 202 by an oxide layer 216, which is also referred to as a layer of tunnel oxide.

When the cell 200 is being programmed, a voltage $V_{CG}$ between 8 and 10 volts is applied to the control gate 210 via the terminal 218, a voltage $V_D$ between 4 and 5.5 volts is applied to the drain region 206 via terminal 220, the source 204 is set to approximately 0 volts via terminal 222 and the substrate 202 is set to approximately 0 volts via terminal 224. The voltage differential $V_{DS}=V_D-V_s$ between the drain 206 and the source 204 causes electron flow through a channel region 226. The electrons e⁻228 are high-energy electrons that have enough energy to migrate through the tunnel oxide 216 onto the floating gate 212. This phenomenon is known as hot carrier injection or hot channel electron programming. The route of the hot electrons from the channel region 226 to the floating gate 212 through the tunnel oxide 216 is indicated by arrow 230.

Figure 3:
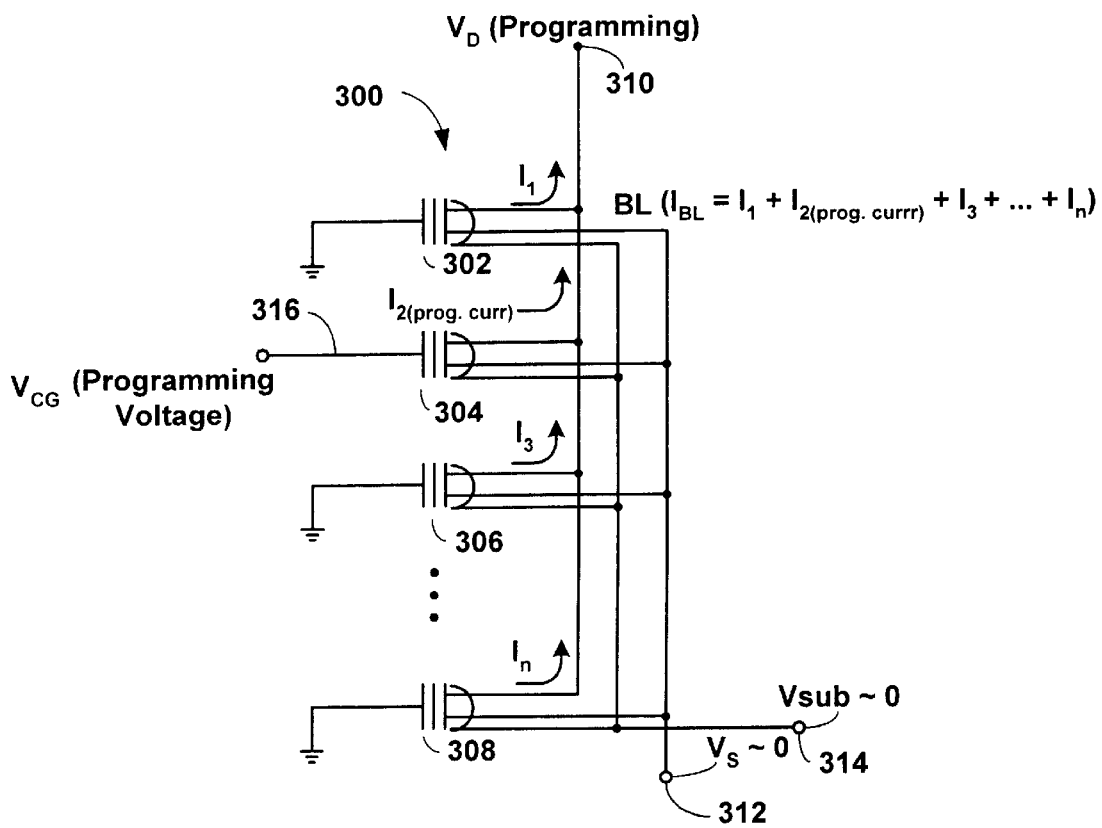
FIG. 3 is a simplified electrical schematic diagram of a column of flash EEPROM cells illustrating the leakage currents occurring during a programming operation in accordance with a prior art method of programming.

FIG. 3 is a simplified electrical schematic diagram of a column 300 of flash EEPROM cells, 302,304,306, and 308. A programming voltage $V_D$ of between 4 and 5.5 volts is applied to the drain terminal 310 and the sources of the cells are connected to a common terminal 312 to which a programming voltage of 0 volts is applied. The p-wells of the cells are connected to a common terminal 314 to which a programming voltage of 0 volts is applied. In order to program, for example, cell 304; a programming voltage is applied to the wordline 316 to which cell 304 is connected. A programming current $I_2$ flows through the cell 304 through its source, channel (not shown) and drain. Ideally, the bitline current $I_{BL}$ is equal to only $I_2$. However, if one or more of the unselected cells, for example cells 302,306, and 308, have low threshold voltages background leakage currents $I_1$, $I_2$, and $I_n$ will flow through the cells 302, 306 and 308, respectively. The bitline current $I_{BL}$ would then be equal to the sum of $I_2$ and the background leakage currents $I_1$, $I_3$ through $I_n$. The leakage currents are caused by the high drain voltage applied to the drain and are due to the drain-induced barrier lowering (DIBL) effect in short channel devices. The combination of a large leakage current from the unselected cells and a large programming current from the selected cell results in unacceptably high total programming currents during device operation.

Figure 4:
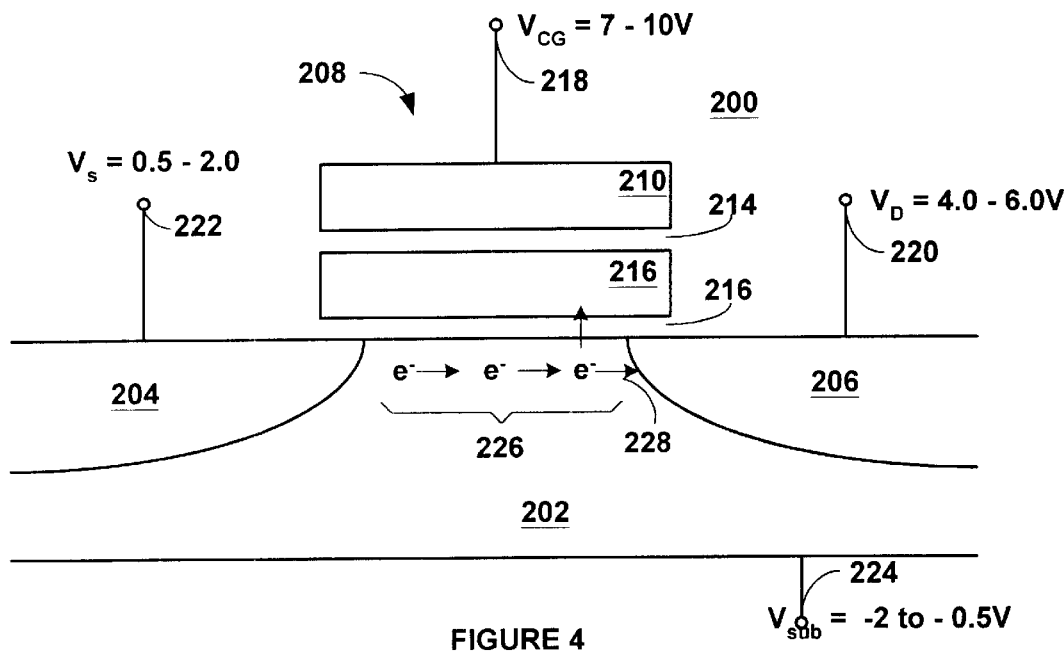
FIG. 4 illustrates the elements of an individual flash memory cell in a programming configuration in accordance with the present invention.

FIG. 4 illustrates the elements of the flash memory cell 200 as shown in FIG. 2 with programming voltages in accordance with the present invention applied to the various elements.

When the cell 200 is being programmed in accordance with the present invention, a voltage $V_{CG}$ between 7 and 10 volts is applied to the control gate 210 via the terminal 218, a voltage $V_D$ between 4 and 6.0 volts is applied to the drain region 206 via the terminal 220, a voltage $V_S$ between 0.5 and 2.0 volts is applied to the source region 204 via terminal 222. It should be remembered that all of the sources have a common terminal so that the voltage $V_S$ is applied to the sources of all cells in the block. A voltage $V_{sub}$ between −2 and −0.5 volts is applied to the substrate 202 via terminal 224. Similarly, it should also be remembered that all of the p-wells (substrate) have a common terminal so that the voltage $V_{sub}$ is applied to the substrates of all of the cells.

Figure 5:
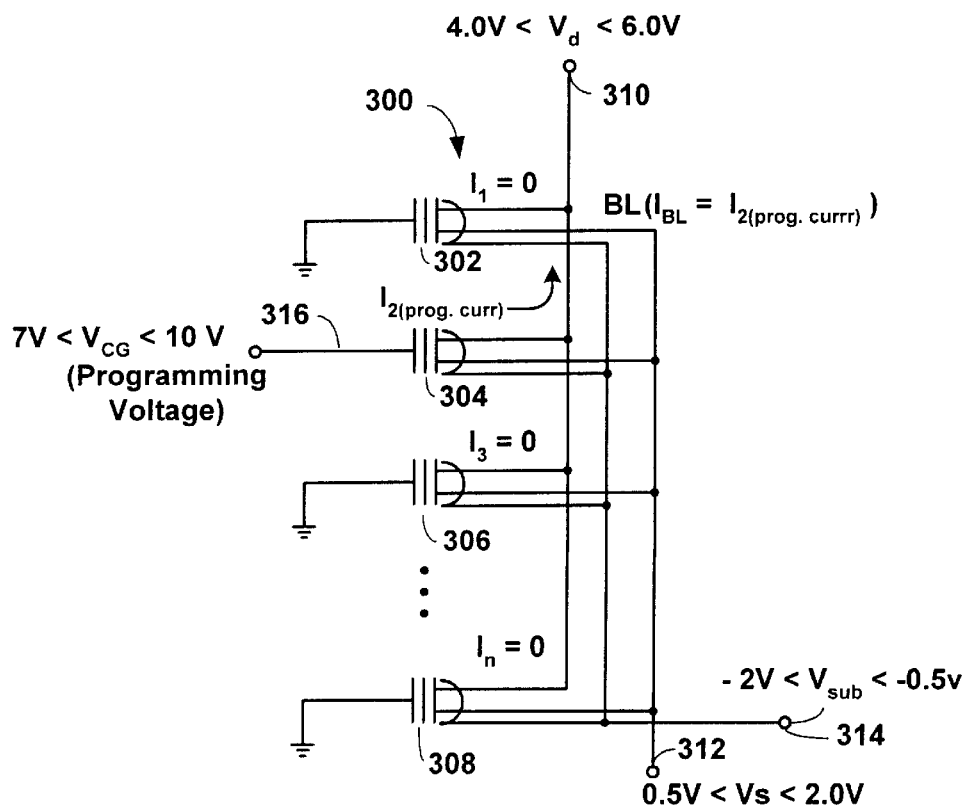
FIG. 5 is a simplified electrical schematic diagram of a column of flash EEPROM cells illustrating the bitline current during a programming operation in accordance with a method of programming in accordance with the present invention.

FIG. 5 is the simplified electrical schematic diagram of the column 300 of flash EEPROM cells as shown in FIG. 3 showing programming voltages applied to the cell terminals in accordance with the present invention. A programming voltage $V_D$ between 4.0 and 5.5 volts is applied to the drain terminal and the sources of the cells are connected to the common source terminal 312 to which a programming voltage $V_S$ of between 0.5 and 2.0 volts is applied. A programming voltage $V_{CG}$ between 7 and 10 volts is applied to the wordline 316 to which the gate of the cell being programmed 304 is connected and a programming voltage $V_{sub}$ between −2 and −0.5 volts is applied to the substrate terminal 314.

The method of programming in accordance with the present invention reduces or substantially eliminates the leakage current for the unselected cells, that is all cells in the column 300, FIG. 5, which typically would be 511 cells that are unselected (512 minus the 1 cell being programmed cell 304, FIG. 5). By selecting the proper combination of programming voltages, the fast programming speed of the selected cell can be maintained. The basic principle of the programming operation of the present invention is to: (1) employ a relatively large source bias voltage during programming in order to back-bias the unselected cells to reduce the column leakage from the unselected cells; and (2) employ a negative p-well or substrate bias in order to increase the lateral electric field of the cell selected to be programmed, which maintains the fast programming speed under the reduced $V_{DS}$ condition. The drain and gate voltages are similar to the drain and gate voltages used in standard hot electron programming. The selection of the correct programming voltages is critical to substantially eliminate the leakage currents from the unselected cells while maintaining the fast programming speed. The selection of the correct programming voltages can be determined for each type flash memory device during a parameter precharacterization procedure. The parameter precharacterization procedure can be by computer simulation or empirically.

Figure 6:
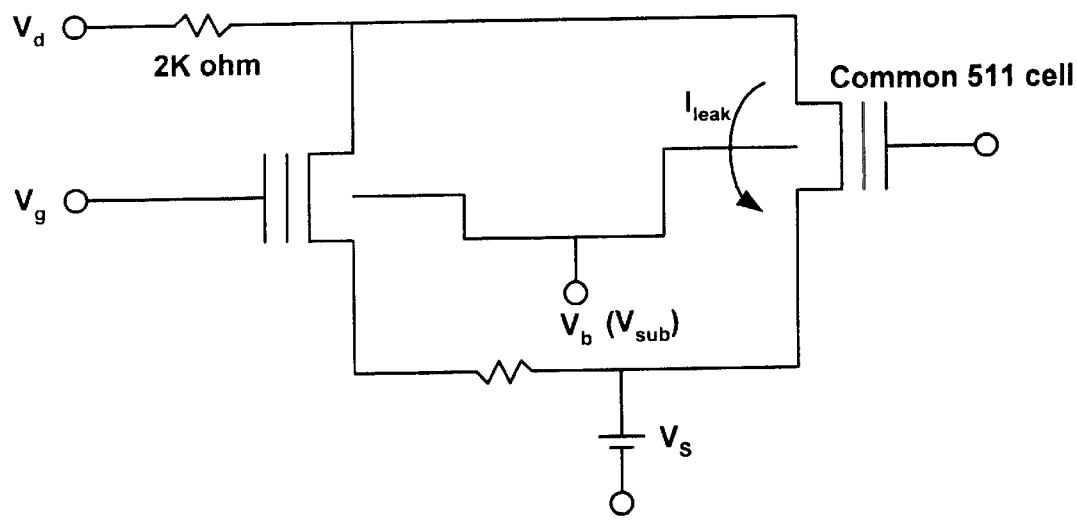

A determination of the effectiveness of using a positive source bias and a negative substrate bias to simultaneously reduce the column leakage while maintaining fast programming speed can be made by utilizing the procedure illustrated in FIG. 6. Measurements were taken on a 512 cell column having varying amounts of column leakage as shown in FIG. 6.

Figure 7:
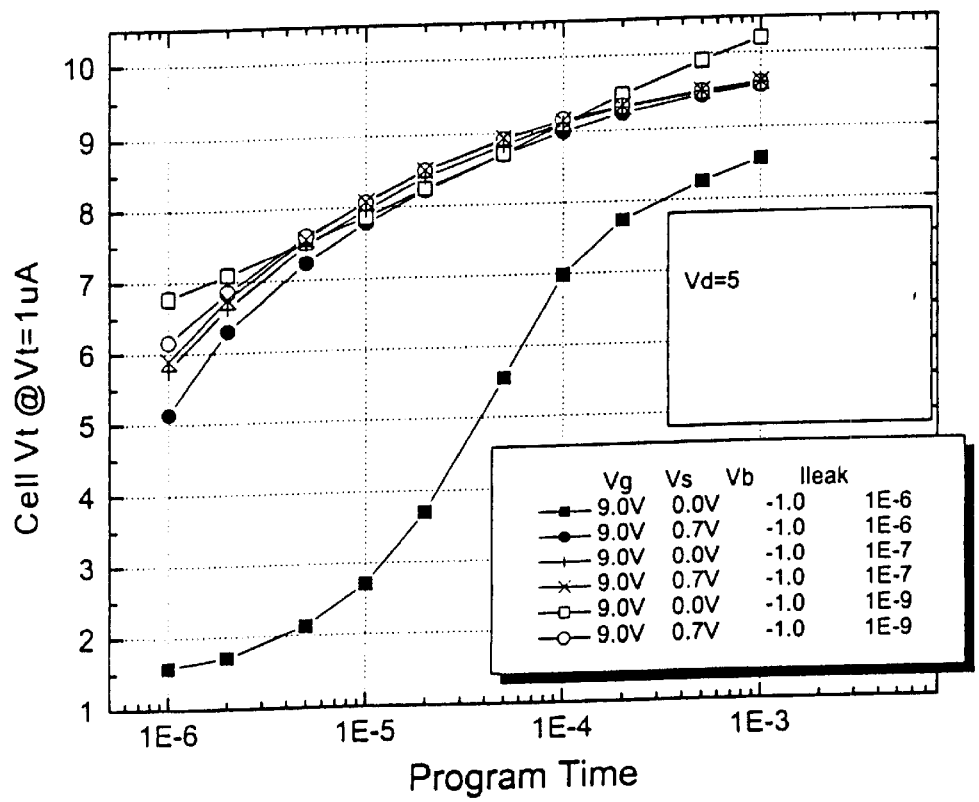

FIG. 7 illustrates that in the case of high column leakage (1E-6) programming is very slow when $V_s=0$ due to loading resulting in a voltage drop of the drain. FIG. 7 also illustrates that when a source bias of 0.7 volts is applied when $V_{sub}$ is=−1 volts, the column leakage is shut off and the programming speed is fast.

Figure 8:
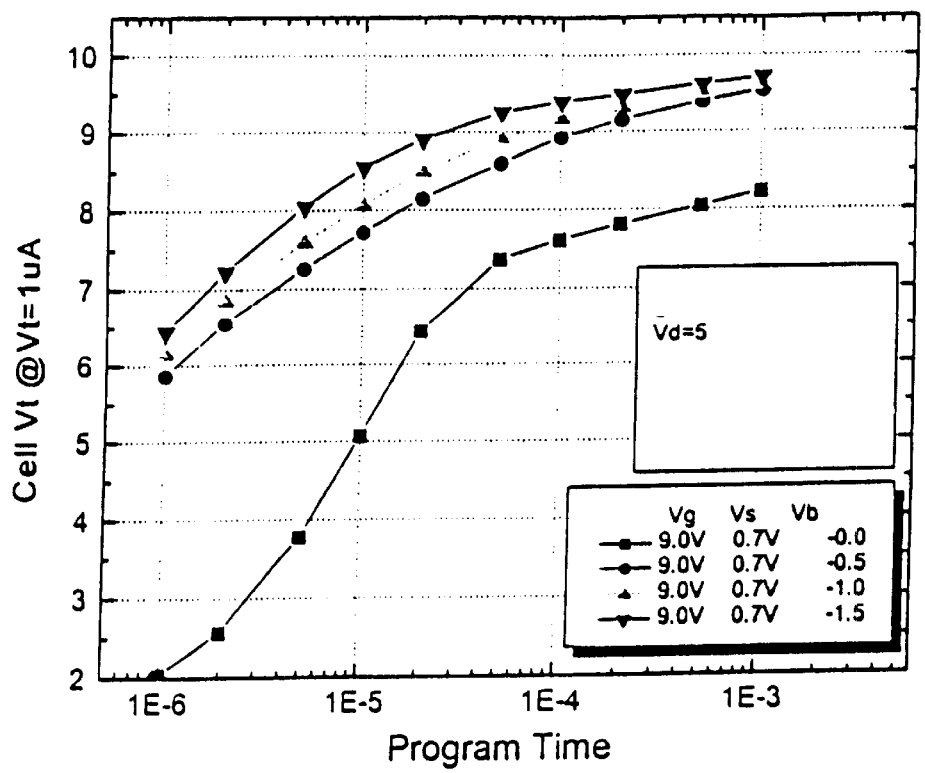

FIG. 8 illustrates the effect of substrate bias. FIG. 8 shows that in order to maintain fast programming speed with a large positive source bias of 0.7 volts, a negative substrate is required.

The inventors have discovered that by applying a positive source bias and a negative substrate bias, it is possible to significantly reduce the column leakage during programming while maintaining fast programming speeds. This method enables channel hot electron programming of short channel devices having Dibl>0.4 volts while maintaining acceptable programming currents.

This method is also applicable to soft programming where typical soft programming voltages would be a $V_{CG}$ voltage between 0.5 and 4.5, a $V_d$ voltage between 4 and 5.5 volts, a $V_s$ between 0.5 and 2 volts and a $V_{sub}$ between −2.0 and 0.5 volts.

Figure 9:
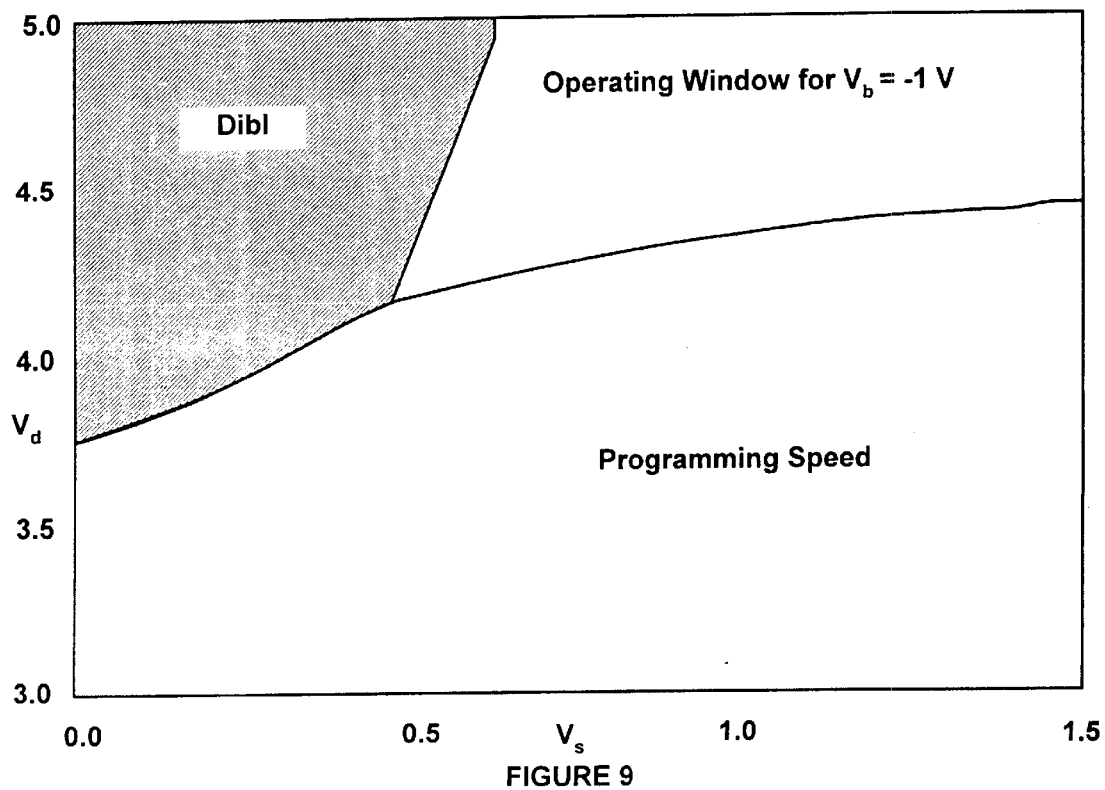
FIG. 9 shows the operating window for a substrate bias $V_b$=−1 V.

FIG. 9 illustrates the operating window (of $V_s$ and $V_d$) to ensure fast programming of a particular short channel device. In this figure, $V_s$ and $V_d$ are varied, while $V_b$ (the substrate voltage) is minus 1 volt. It is shown that a $V_s>0.5V$ is required in order to reduce the column leakage during programming.

In summary, the described invention thus provides methods of programming and soft programming short channel NOR flash memory cells that reduce the programming currents and column leakages during the programming and soft programming operations.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of programming a flash memory device having multiple flash memory cells formed in rows and columns with a flash memory cell located at each intersection of a column and a row and each flash memory cell having a control gate and a floating gate formed over a substrate and each flash memory cell having a source and a drain formed in the substrate, wherein the drains in each column have a common terminal and wherein the sources have a common terminal and wherein the substrates have a common terminal, the method comprising:

selecting a cell to be programmed;

applying a selected programming voltage between 7 and 10 volts to the control gate of the selected cell to be programmed;

applying a selected programming voltage between 4 and 6.0 volts to the drain of the selected cell to be programmed via the common terminal to which the drain of the selected cell is connected;

applying a selected programming voltage between 0.5 and 2.0 volts to the sources of all the flash memory cells; and applying a selected programming voltage between minus 2 and minus 0.5 volts to the substrates of all the flash memory cells.

2. The method of claim 1 wherein the selected programming voltages are determined during a precharacterization procedure.

3. The method of claim 2 wherein the precharacterization procedure is a computer modeling characterization procedure.

4. The method of claim 2 wherein the precharacterization procedure is an empirical characterization procedure.

5. A method of soft programming a flash memory device having multiple flash memory cells formed in rows and columns with a flash memory cell located at each intersection of a column and a row and each flash memory cell having a control gate and a floating gate formed over a substrate and each flash memory cell having a source and a drain formed in the substrate, wherein the drains in each column have a common terminal and wherein the sources have a common terminal and wherein the substrates have a common terminal, the method comprising:

applying soft programming voltages to the drains, sources and control gates of selected memory cells, wherein the soft programming voltages are as follows:

a voltage between 4 and 5.5 volts applied to the drains of the selected memory cells;

a voltage between minus 2.0 volts and minus 0.5 volts applied to the substrates of the selected memory cells;

a voltage between 0.5 volts and 4.5 volts applied to the control gates of the selected memory cells; and a voltage between 0.5 volts and 2 volts is applied to the sources of the selected memory cells.

6. The method of claim 5 wherein the selected soft programming voltages are determined during a precharacterization procedure.

7. The method of claim 6 wherein the precharacterization procedure is a computer modeling characterization procedure.

8. The method of claim 6 wherein the precharacterization procedure is an empirical characterization procedure.

* * * * *